United States Patent
Tapily et al.

(10) Patent No.: US 10,068,764 B2
(45) Date of Patent: Sep. 4, 2018

(54) SELECTIVE METAL OXIDE DEPOSITION USING A SELF-ASSEMBLED MONOLAYER SURFACE PRETREATMENT

(71) Applicant: Tokyo Electron Limited, Minato-ku, Tokyo (JP)

(72) Inventors: Kandabara N. Tapily, Mechanicville, NY (US); Gerrit J. Leusink, Rexford, NY (US); Cory Wajda, Sand Lake, NY (US); Hoyoung Kang, Guilderland, NY (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 15/701,780

(22) Filed: Sep. 12, 2017

(65) Prior Publication Data
US 2018/0076027 A1  Mar. 15, 2018

Related U.S. Application Data

(60) Provisional application No. 62/394,129, filed on Sep. 13, 2016.

(51) Int. Cl.
*H01L 21/302* (2006.01)
*H01L 21/461* (2006.01)
*H01L 21/02* (2006.01)
*H01L 21/311* (2006.01)

(52) U.S. Cl.
CPC .. *H01L 21/02304* (2013.01); *H01L 21/02172* (2013.01); *H01L 21/02205* (2013.01); *H01L 21/31111* (2013.01)

(58) Field of Classification Search
USPC .......................................... 438/754
See application file for complete search history.

(56) References Cited

U.S. PATENT DOCUMENTS

2011/0180906 A1\* 7/2011 Wessels ................. B82Y 10/00
                                                         257/618

\* cited by examiner

*Primary Examiner* — Roberts Culbert

(57) ABSTRACT

Embodiments of the invention provide methods for selective film deposition using a surface pretreatment. According to one embodiment, the method includes providing a substrate containing a dielectric layer and a metal layer, exposing the substrate to a reactant gas containing a molecule that forms self-assembled monolayers (SAMs) on the substrate, and thereafter, selectively depositing a metal oxide film on a surface of the dielectric layer relative to a surface of the metal layer by exposing the substrate to a deposition gas.

20 Claims, 14 Drawing Sheets

US 10,068,764 B2

SELECTIVE METAL OXIDE DEPOSITION USING A SELF-ASSEMBLED MONOLAYER SURFACE PRETREATMENT

CROSS-REFERENCE TO RELATED APPLICATIONS

This application is related to and claims priority to U.S. Provisional Patent Application Ser. No. 62/394,129 filed on Sep. 13, 2016, the entire contents of which are herein incorporated by reference.

FIELD OF THE INVENTION

The present invention relates to semiconductor processing and semiconductor devices, and more particularly, to methods for selective film deposition using a surface pretreatment.

BACKGROUND OF THE INVENTION

As device size is getting smaller, the complexity in semiconductor device manufacturing is increasing. The cost to produce the semiconductor devices is also increasing and cost effective solutions and innovations are needed. As smaller transistors are manufactured, the critical dimension (CD) or resolution of patterned features is becoming more challenging to produce. Selective deposition of thin films is a key step in patterning in highly scaled technology nodes. New deposition methods are required that provide selective film deposition on different material surfaces.

SUMMARY OF THE INVENTION

Embodiments of the invention provide methods for selective film deposition using a surface pretreatment.

A method of processing a substrate is provided. According to one embodiment, the method includes providing a substrate containing a dielectric layer and a metal layer, exposing the substrate to a reactant gas containing a molecule that forms self-assembled monolayers (SAMs) on the substrate, and thereafter, selectively depositing a metal oxide film on a surface of the dielectric layer relative to a surface of the metal layer by exposing the substrate to a deposition gas.

According to another embodiment of the invention, the method includes providing a substrate containing a dielectric layer and a metal layer, exposing the substrate to a reactant gas containing a molecule that forms self-assembled monolayers (SAMs) on the substrate, thereafter, selectively forming a metal-containing catalyst layer on a surface of the dielectric layer relative to a surface of the metal layer by exposing the substrate to a gas containing a metal-containing precursor, and in the absence of any oxidizing and hydrolyzing agent, at a substrate temperature of approximately 150° C., or less, exposing the substrate to a process gas containing a silanol gas to selectively deposit a $SiO_2$ film on the metal-containing catalyst layer relative to the metal layer.

BRIEF DESCRIPTION OF THE DRAWINGS

A more complete appreciation of embodiments of the invention and many of the attendant advantages thereof will become readily apparent with reference to the following detailed description, particularly when considered in conjunction with the accompanying drawings, in which.

DETAILED DESCRIPTION OF SEVERAL EMBODIMENTS

Some embodiments of the invention provide methods for effective surface pretreatment for selectively depositing metal oxide films dielectric material surfaces. The selective deposition is achieved by providing long incubation times on metal layer surfaces and oxidized metal layer surfaces where metal oxide deposition is not desired, while providing fast and effective deposition on dielectric material surfaces where metal oxide deposition is desired. Embodiments of the invention may be applied to surface sensitive deposition processes such as atomic layer deposition (ALD), and chemical vapor deposition (CVD), and spin-on deposition. This improved selectivity provides an improved margin for line-to-line breakdown and electrical leakage performance in the semiconductor device containing the metal layer surface.

Figure 1A:
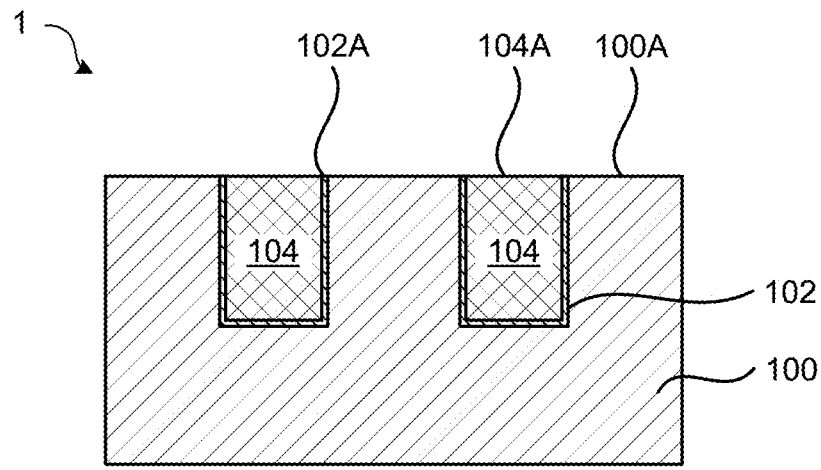
FIGS. 1A and 1B show schematic cross-sectional views of a method of selectively depositing a metal oxide film a substrate according to an embodiment of the invention.
Figure 1B:
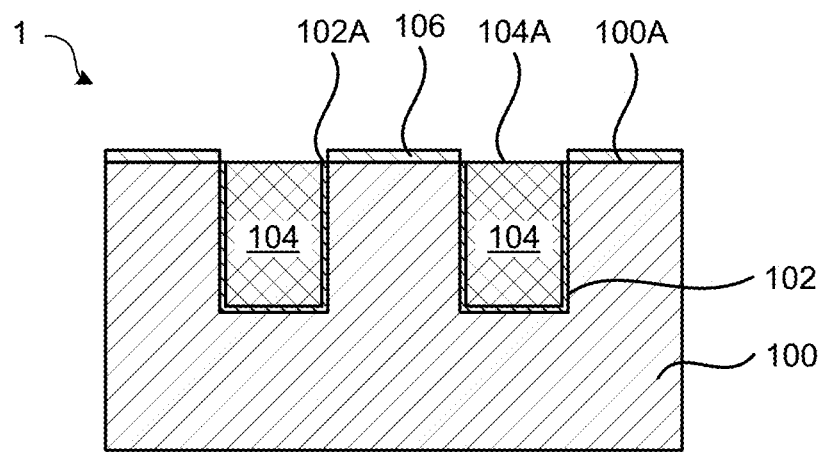

FIGS. 1A and 1B show schematic cross-sectional views of a method of selectively depositing a metal oxide film a substrate according to an embodiment of the invention. In FIG. 1A, the substrate 1 contains a dielectric material layer 100 having a surface 100A, a metal layer 104 having a surface 104A, and an optional diffusion barrier layer 102 having a surface 102A. The dielectric material layer 100 can, for example, contain $SiO_2$ or a metal-containing dielectric material. In one example, the metal-containing dielectric material can contain a metal oxide, a metal nitride, or a metal oxynitride. In some examples, the metal layer 104 contains Cu, Al, Ta, Ti, W, Ru, Co, Ni, or Mo.

According to one embodiment, the substrate 1 in FIG. 1A is pretreated by exposure to a reactant gas that contains a molecule that is capable of forming self-assembled monolayers (SAMs) on the substrate 1. SAMs are molecular assemblies that are formed spontaneously on substrate surfaces by adsorption and are organized into more or less large ordered domains. The SAMs can include a molecule that possesses a head group, a tail group, and a functional end group, and SAMs are created by the chemisorption of head groups onto the substrate from the vapor phase at room temperature or above room temperature, followed by a slow organization of the tail groups. Initially, at small molecular density on the surface, adsorbate molecules form either a disordered mass of molecules or form an ordered two-dimensional "lying down phase", and at higher molecular coverage, over a period of minutes to hours, begin to form three-dimensional crystalline or semicrystalline structures on the substrate surface. The head groups assemble together on the substrate, while the tail groups assemble far from the substrate.

According to one embodiment, the head group of the molecule forming the SAMs can include a thiol, a silane, or a phosphonate. Examples of silanes include molecule that include C, H, Cl, F, and Si atoms, or C, H, Cl, and Si atoms. Non-limiting examples of the molecule include perfluorodecyltrichlorosilane ($CF_3(CF_2)_7CH_2CH_2SiCl_3$), perfluorodecanethiol ($CF_3(CF_2)_7CH_2CH_2SH$), chlorodecyldimethylsilane ($CH_3(CH_2)_8CH_2Si(CH_3)_2Cl$), and tertbutyl(chloro)dimethylsilane (($CH_3)_3CSi(CH_3)_2Cl$)).

The inventors have discovered that a pretreatment that forms SAMs on a substrate to may be used to enable subsequent selective metal oxide deposition on dielectric material surfaces relative to metal layer surfaces or oxidized metal layer surfaces. This selective deposition behavior is unexpected and provides a new method for selectively depositing metal oxide films on dielectric material surfaces while preventing or reducing metal oxide deposition on metal layer surfaces and oxidized metal layer surfaces. It is speculated that the SAM density is greater on the metal layer surfaces and oxidized metal layer surfaces, possible due to higher initial ordering of the molecules on those surfaces relative to on the dielectric material surfaces. This method of selective deposition may be used to eliminate many currently used processing steps for selective formation of metal oxide films on dielectric material surfaces.

According to one embodiment, the surface 104A of the metal layer 104 may be oxidized prior to or during the pretreatment with the reactant gas. The oxidation may be performed by exposing the substrate 1 to an oxidation gas, for example $H_2O$.

Following the pretreatment, a metal oxide film 106 is selectively deposited on the surface 100A of the dielectric material layer 100 relative to the surface 104A of the metal layer 104 by exposing the substrate 1 to a deposition gas. In one example, the metal oxide film 106 may contain $HfO_2$, $ZrO_2$, or $Al_2O_3$. The metal oxide film 106 may, for example, be deposited by ALD or plasma-enhanced ALD (PEALD). In some examples, the metal oxide film 106 may be deposited by ALD using alternating exposures of a metal-containing precursor and an oxidizer (e.g., $H_2O$, $H_2O_2$, plasma-excited $O_2$ or $O_3$).

Figure 2A:
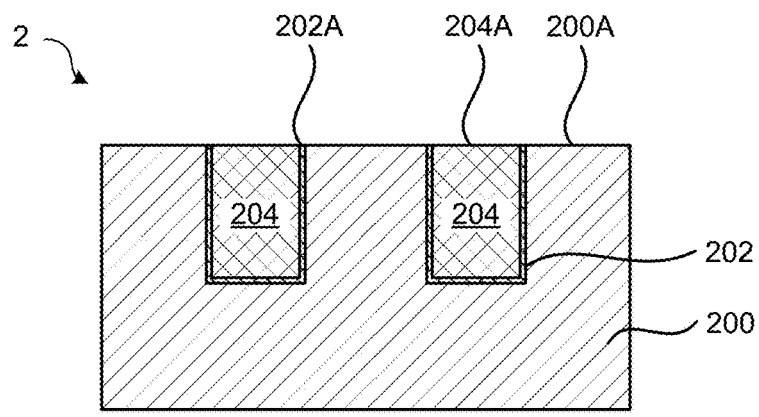
FIGS. 2A-2C show schematic cross-sectional views of a method of selectively forming a metal oxide film on a substrate according to an embodiment of the invention.
Figure 2B:
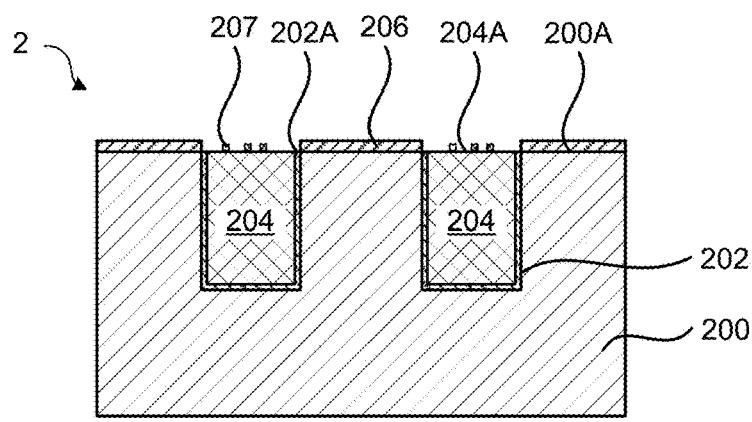
Figure 2C:
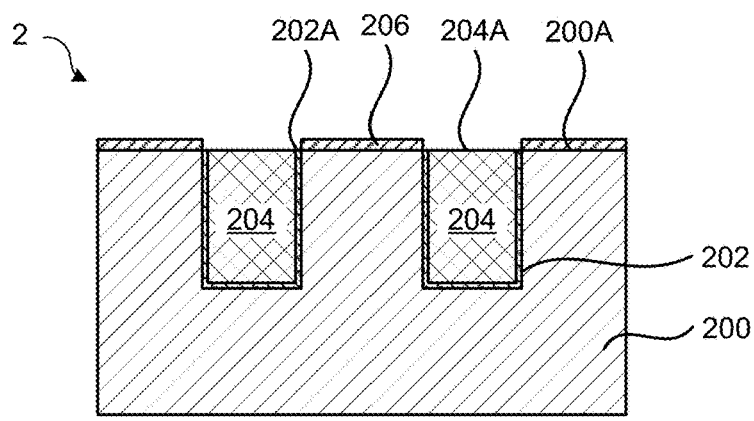

FIGS. 2A-2C show schematic cross-sectional views of a method of selectively forming a metal oxide film on a substrate according to an embodiment of the invention. The method illustrated in FIGS. 2A-2C is similar to the method in FIGS. 1A and 1B. The substrate 2 in FIG. 2A contains a dielectric material layer 200 having a surface 200A, a metal layer 204 having a surface 204A, and an optional diffusion barrier layer 202 having a surface 202A. The dielectric material layer can, for example, contain $SiO_2$ or a metal-containing dielectric material. In one example, the metal-containing dielectric material can contain a metal oxide, a metal nitride, or a metal oxynitride. In some examples, the metal layer 204 contains Cu, Al, Ta, Ti, W, Ru, Co, Ni, or Mo.

According to one embodiment, the substrate 2 in FIG. 2A is pretreated by exposure to a reactant gas that contains a molecule that is capable of forming self-assembled monolayers (SAMs) on the substrate 2. Following the pretreatment, a metal oxide film 206 is substantially selectively deposited on the surface 200A of the dielectric material layer 200 relative to the surface 204A of the metal layer 204 by exposing the substrate 2 to a deposition gas. In one example, the metal oxide film 206 may contain $HfO_2$, $ZrO_2$, or $Al_2O_3$. The metal oxide film 206 may, for example, be deposited by ALD or PEALD. In some examples, the metal oxide film 206 may be deposited by ALD using alternating exposures of a metal-containing precursor and an oxidizer (e.g., $H_2O$, $H_2O_2$, plasma-excited $O_2$ or $O_3$).

As depicted in FIG. 2B, the exposure to the deposition gas may, in addition to depositing the metal oxide film 206 on the surface 200A of the dielectric material layer 200, form metal oxide nuclei 207 on the surface 204A of the metal layer 204. This can occur if the deposition process is carried out for too long or if the deposition selectivity is inadequate. The metal oxide nuclei 207 may be removed using an etching process in order to selectively form the metal oxide film 206 on the surface 200A of the dielectric material layer 200. The etching process can include a dry etching process, a wet etching process, or a combination thereof. In one example, the etching process may include an atomic layer etching (ALE) process. The resulting substrate 2 shown in FIG. 2C has the metal oxide film 206 selectively formed on the surface 200A of the dielectric material layer 200.

Figure 3A:
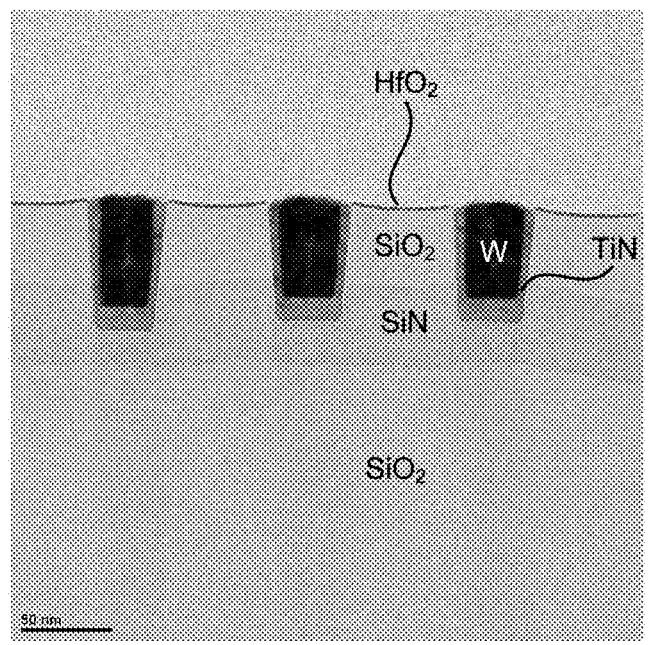
FIGS. 3A and 3B show cross-sectional transmission electron microscopy (TEM) images of a $HfO_2$ film selectively deposited on a substrate according to an embodiment of the invention.
Figure 3B:
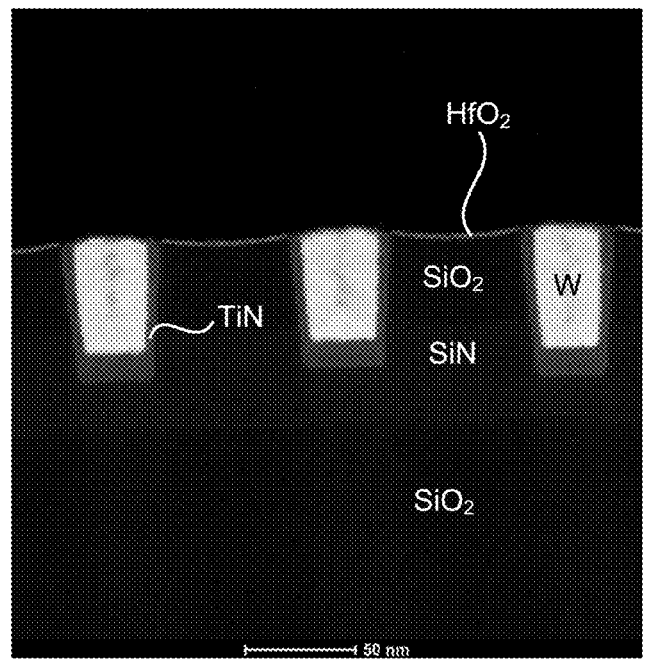

FIGS. 3A and 3B show cross-sectional TEM images of a $HfO_2$ film selectively deposited on a substrate according to an embodiment of the invention. FIG. 3A shows a bright-field TEM image of the $HfO_2$ film selectively deposited on a $SiO_2$ layer according to an embodiment of the invention. The substrate contained a W metal layer and a TiN diffusion barrier layer separating the W metal layer from the $SiO_2$ layer. The substrate further contained a SiN layer below the $SiO_2$ layer and a base $SiO_2$ layer below the SiN layer. The substrate was pretreated using a saturation exposure of perfluorodecyltrichlorosilane. The substrate surfaces were not cleaned of any contaminants prior to perfluorodecyltrichlorosilane exposure, and therefore likely contained an oxidized surface of the W metal layer. The $HfO_2$ film was deposited by ALD using 20 deposition cycles of alternating exposures of a hafnium-containing precursor and an oxidizer. FIG. 3B shows a dark-field TEM image of the substrate in FIG. 3A, where the heavier elements (W, Hf) appear brighter than the lighter elements (Ti, Si). FIGS. 3A and 3B show that the $HfO_2$ film was selectively deposited on the $SiO_2$ layer relative to the W metal layer when using a perfluorodecyltrichlorosilane pretreatment and 20 $HfO_2$ ALD deposition cycles.

Figure 4A:
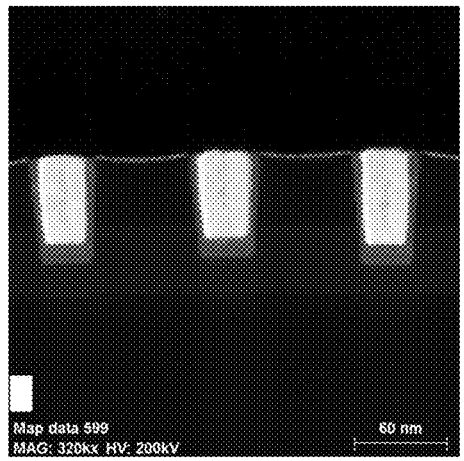
FIG. 4A shows a cross-sectional TEM image of a $HfO_2$ film selectively deposited on a substrate according to an embodiment of the invention.
Figure 4B:
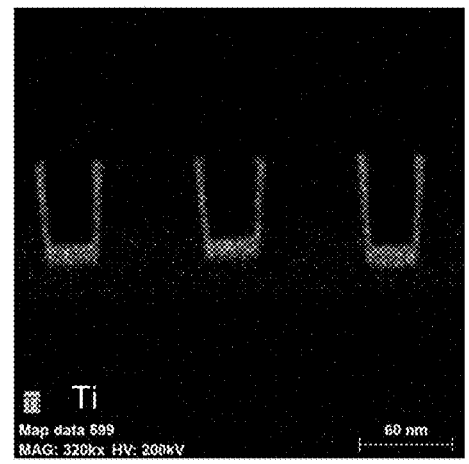
FIGS. 4B-4G shows elemental maps for Ti, W, N, Si, O, and Hf for the substrate in FIG. 4A.
Figure 4C:
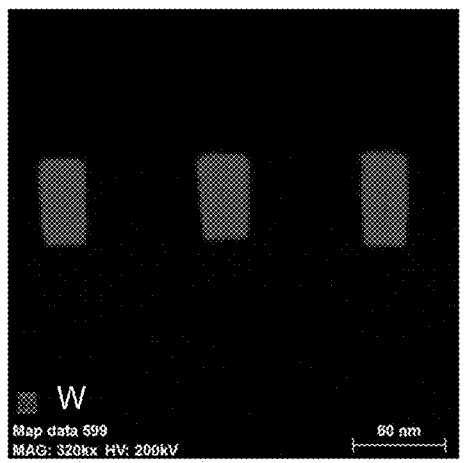
Figure 4D:
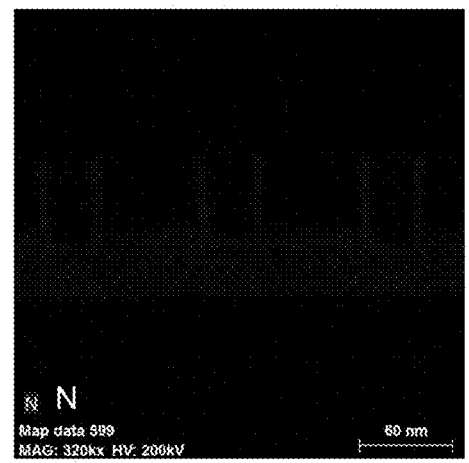
Figure 4E:
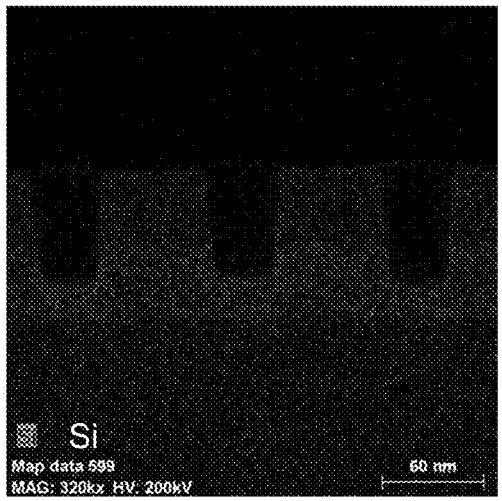
Figure 4F:
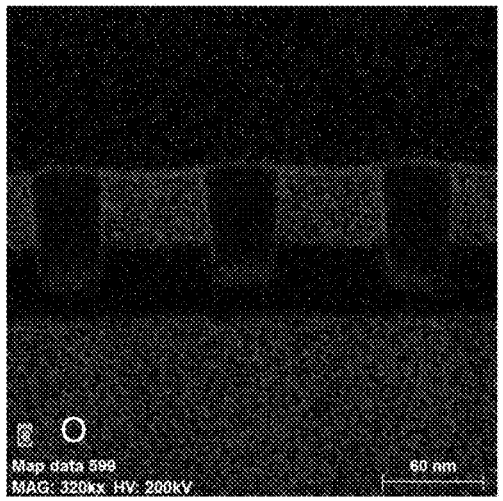
Figure 4G:
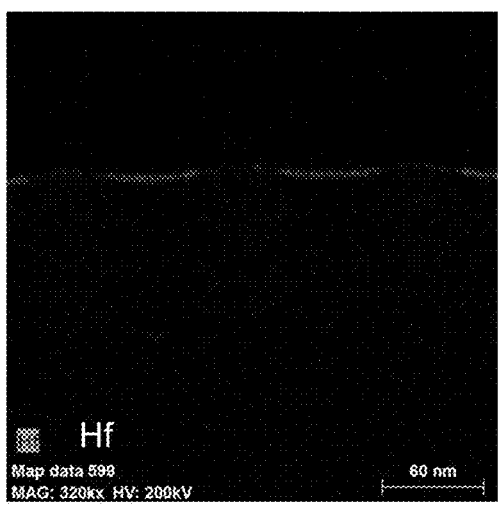

FIG. 4A shows a cross-sectional TEM image of a $HfO_2$ film selectively deposited on a substrate according to an embodiment of the invention, and FIGS. 4B-4G shows elemental maps for Ti, W, N, Si, O, and Hf, respectively, for the substrate in FIG. 4A. FIG. 4G clearly shows that the HfO$_2$ film was selectively deposited on the SiO$_2$ layer relative to the W metal layer.

Figure 5A:
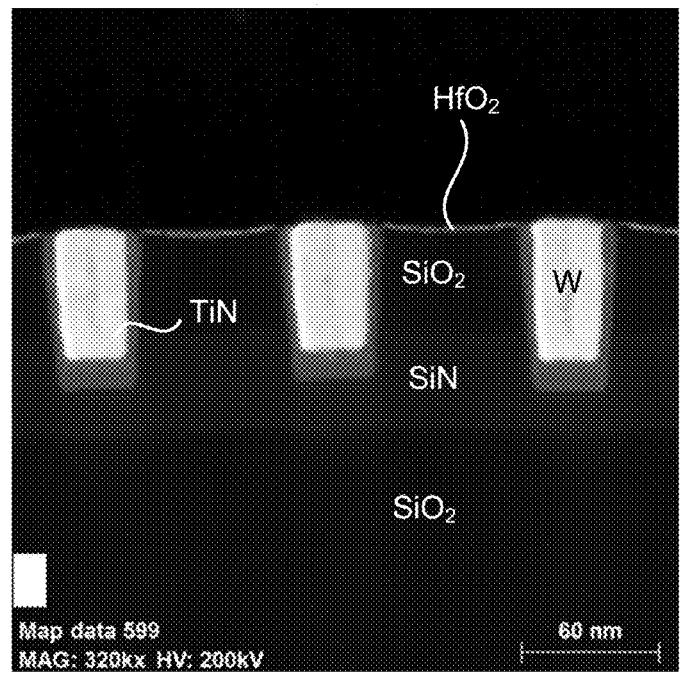
FIGS. 5A and 5B show cross-sectional TEM images of a $HfO_2$ film selectively deposited on a substrate according to an embodiment of the invention.
Figure 5B:
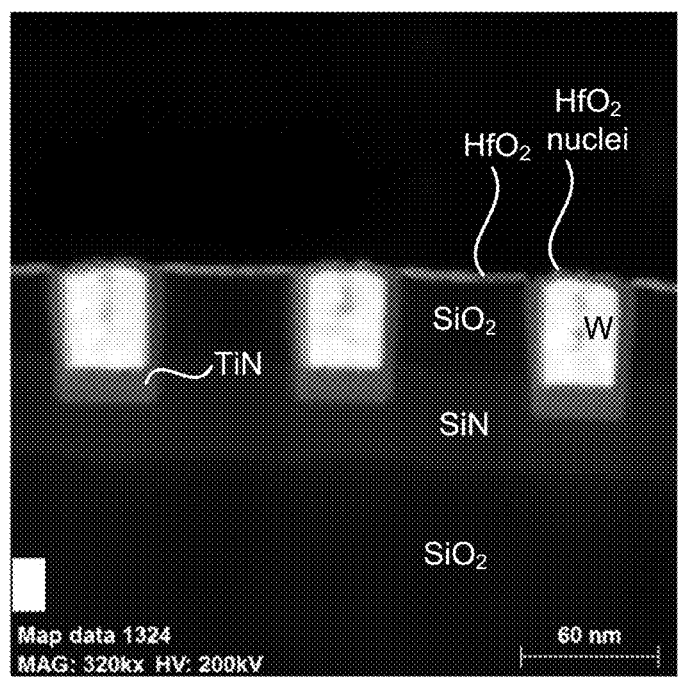

FIGS. 5A and 5B show cross-sectional TEM images of a HfO$_2$ film selectively deposited on a substrate according to an embodiment of the invention. The substrate was described above in reference to FIG. 3A. After a perfluorodecyltrichlorosilane pretreatment, the HfO$_2$ film was deposited by ALD using 20 deposition cycles (FIG. 5A) and 40 deposition cycles (FIG. 5B). The dark-field TEM images in FIGS. 5A and 5B show that the HfO$_2$ film is selectively deposited on the SiO$_2$ layer up to about 40 HfO$_2$ deposition cycles, where HfO$_2$ nuclei begin to appear on the W metal layer. A thickness of the HfO$_2$ film on the SiO$_2$ layer was about 2.5-3 nm after 40 HfO$_2$ deposition cycles.

Figure 5C:
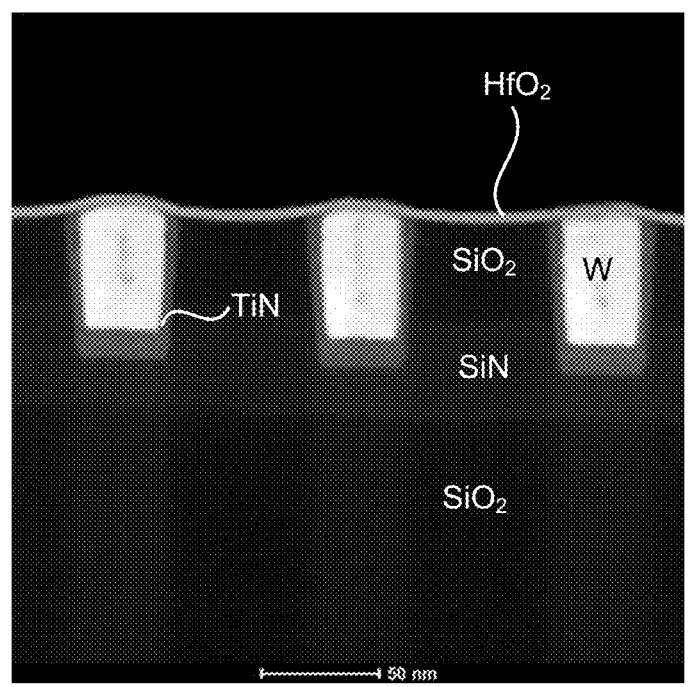
FIG. 5C show a cross-sectional TEM image of a substrate containing a blanket $HfO_2$ film.

FIG. 5C show a cross-sectional TEM image of a substrate containing a blanket HfO$_2$ film. The blanket HfO$_2$ film was deposited using 40 HfO$_2$ deposition cycles but omitting the perfluorodecyltrichlorosilane pretreating. A comparison of the results in FIGS. 5A-5C shows that 1) without the perfluorodecyltrichlorosilane pretreating, a HfO$_2$ film is non-selectively deposited on both the surface of the SiO$_2$ layer and the surface of the W metal layer; and 2) the perfluorodecyltrichlorosilane pretreating results in a longer incubation time for HfO$_2$ deposition on the W metal layer than on the SiO$_2$ layer, thereby enabling selective HfO$_2$ film deposition on the surface of the SiO$_2$ layer.

Figure 6A:
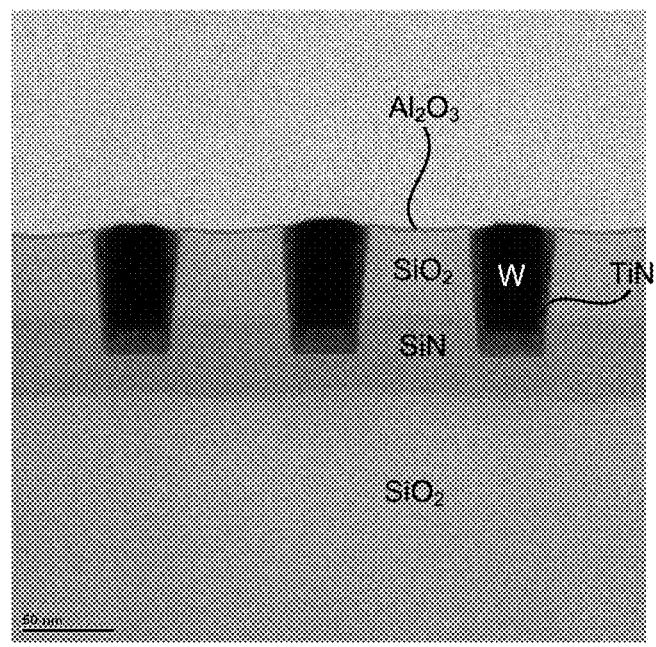
FIGS. 6A and 6B show cross-sectional TEM images of an $Al_2O_3$ film selectively deposited on a substrate according to an embodiment of the invention.
Figure 6B:
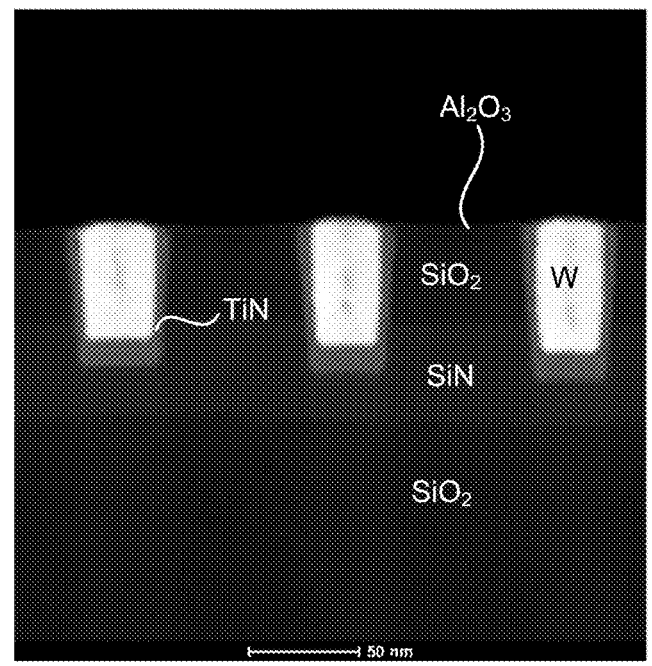

FIGS. 6A and 6B show cross-sectional TEM images of an Al$_2$O$_3$ film selectively deposited on a substrate according to an embodiment of the invention. FIG. 6A shows a bright-field TEM image of the Al$_2$O$_3$ film selectively deposited on a SiO$_2$ layer according to an embodiment of the invention. The substrate in FIGS. 6A and 6B contained a W metal layer and a TiN diffusion barrier layer separating the W metal layer from the SiO$_2$ layer. The substrate further contained a SiN layer below the SiO$_2$ layer and a base SiO$_2$ layer below the SiN layer. The substrate was pretreated using a saturation exposure of perfluorodecyltrichlorosilane. The substrate surfaces were not cleaned of any contaminants prior to perfluorodecyltrichlorosilane exposure, and therefore likely contained an oxidized W metal layer. The Al$_2$O$_3$ film was deposited by ALD using 40 deposition cycles of alternating exposures of an aluminum-containing precursor and an oxidizer. FIG. 6B shows a dark-field TEM image of the substrate in FIG. 6A. Since Al is a light element, the Al$_2$O$_3$ film on the SiO$_2$ layer is not as clearly visible as the HfO$_2$ layer on the SiO$_2$ layer in FIG. 3B.

Figure 7A:
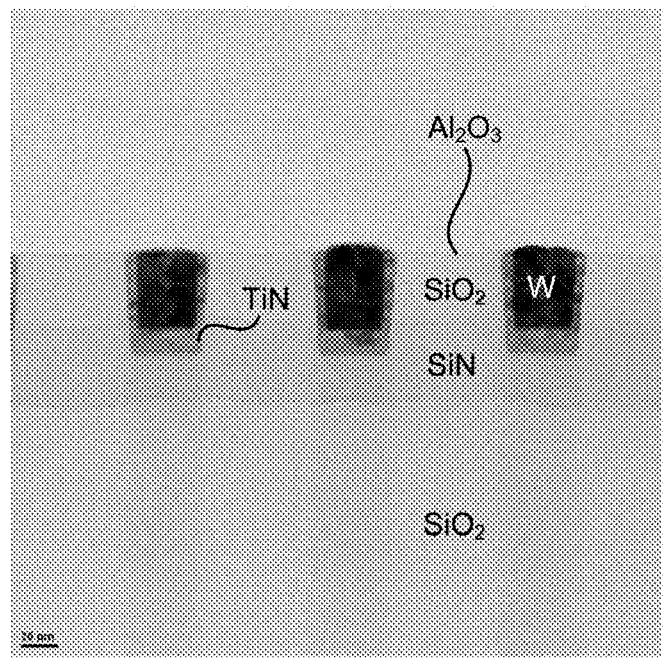
FIGS. 7A and 7B show cross-sectional TEM images of an $Al_2O_3$ film selectively deposited on a substrate according to an embodiment of the invention.
Figure 7B:
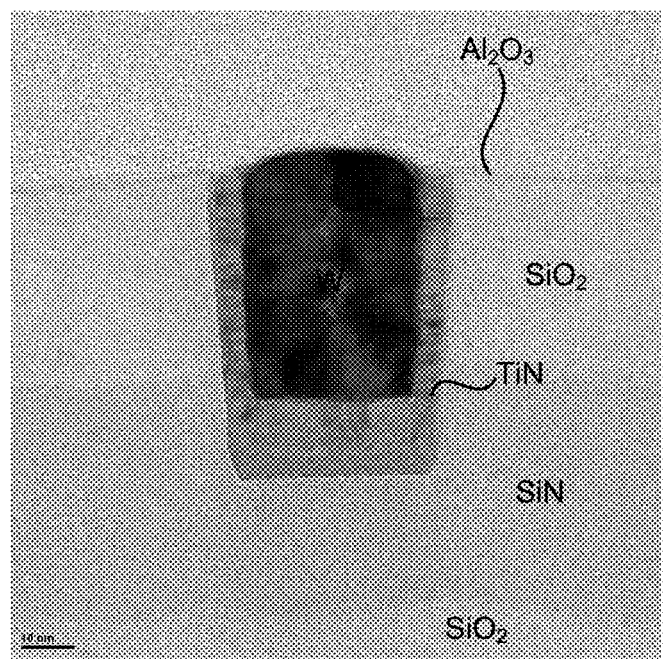

FIGS. 7A and 7B show cross-sectional TEM images of an Al$_2$O$_3$ film selectively deposited on a substrate according to an embodiment of the invention. The substrate was pretreated using a saturation exposure of perfluorodecyltrichlorosilane and the Al$_2$O$_3$ film was deposited by ALD using 20 deposition cycles of alternating exposures of an aluminum-containing precursor and an oxidizer.

Figure 8A:
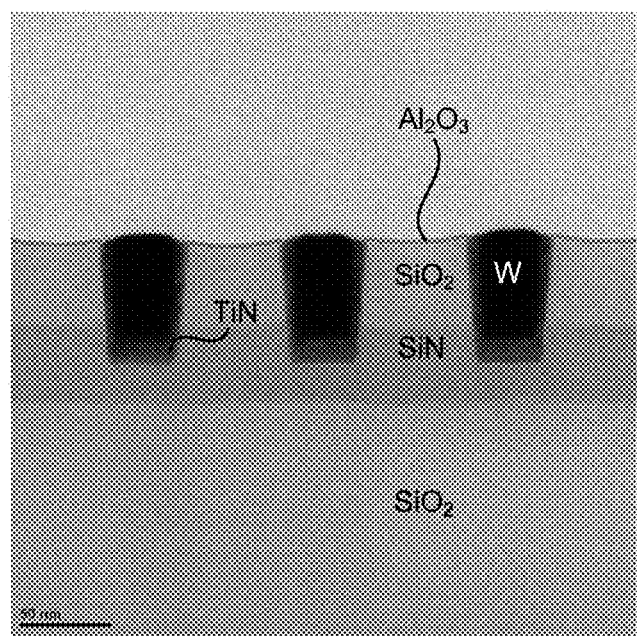
FIGS. 8A and 8B show cross-sectional TEM images of an $Al_2O_3$ film selectively deposited on a substrate according to an embodiment of the invention.
Figure 8B:
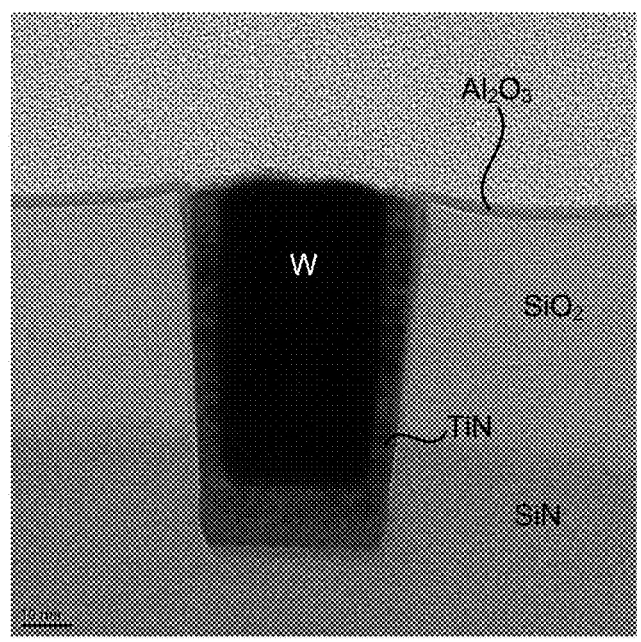

FIGS. 8A and 8B show cross-sectional TEM images of an Al$_2$O$_3$ film selectively deposited on a substrate according to an embodiment of the invention. The substrate was pretreated using a saturation exposure of perfluorodecyltrichlorosilane and the Al$_2$O$_3$ film was deposited by ALD using 40 deposition cycles of alternating exposures of an aluminum-containing precursor and an oxidizer.

Figure 9A:
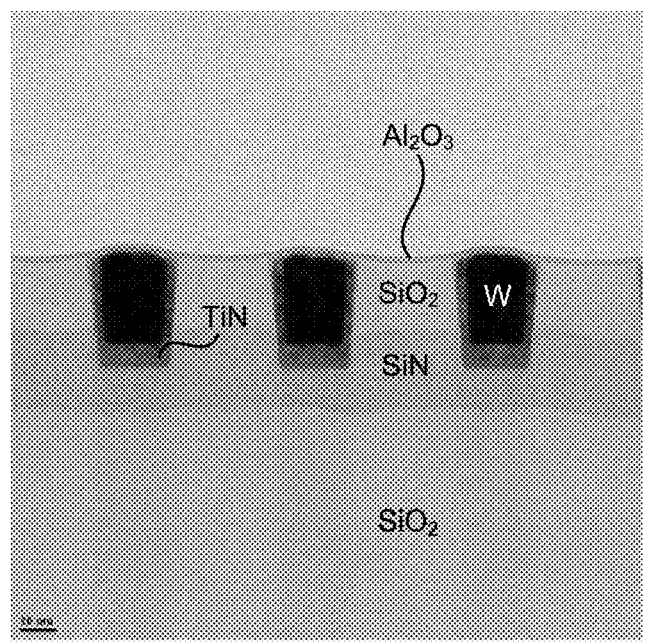
FIGS. 9A and 9B show cross-sectional TEM images of a substrate containing a blanket $Al_2O_3$ film.
Figure 9B:
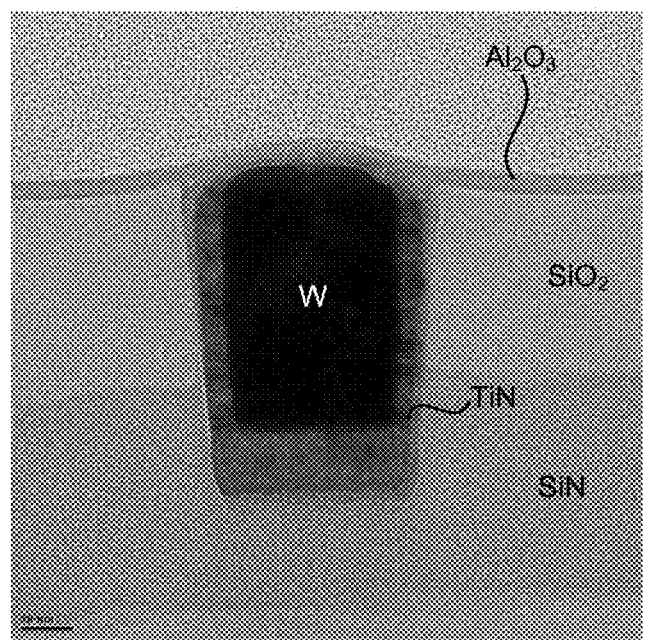

FIGS. 9A and 9B show cross-sectional TEM images of a substrate containing a blanket Al$_2$O$_3$ film. The substrate was not pretreated with perfluorodecyltrichlorosilane and the Al$_2$O$_3$ film was deposited by ALD using 40 deposition cycles of alternating exposures of an aluminum-containing precursor and an oxidizer. A comparison of FIGS. 7-9 shows that 1) without the perfluorodecyltrichlorosilane pretreating, a Al$_2$O$_3$ film is non-selectively deposited on both the SiO$_2$ layer and the W metal layer; 2) the perfluorodecyltrichlorosilane pretreating results in a longer incubation time for Al$_2$O$_3$ deposition on the W metal layer than on the SiO$_2$ layer, thereby enabling selective Al$_2$O$_3$ film deposition on the surface of the SiO$_2$ layer.

Figure 10A:
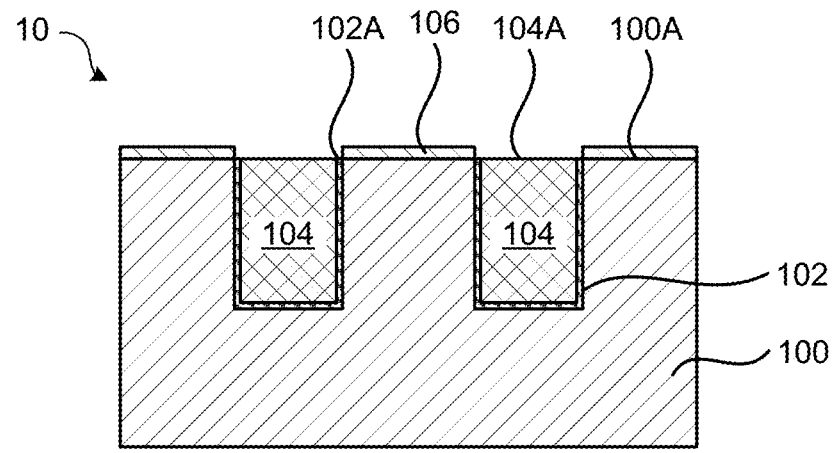
FIGS. 10A-10B show schematic cross-sectional views of a method of processing a substrate according to an embodiment of the invention.
Figure 10B:
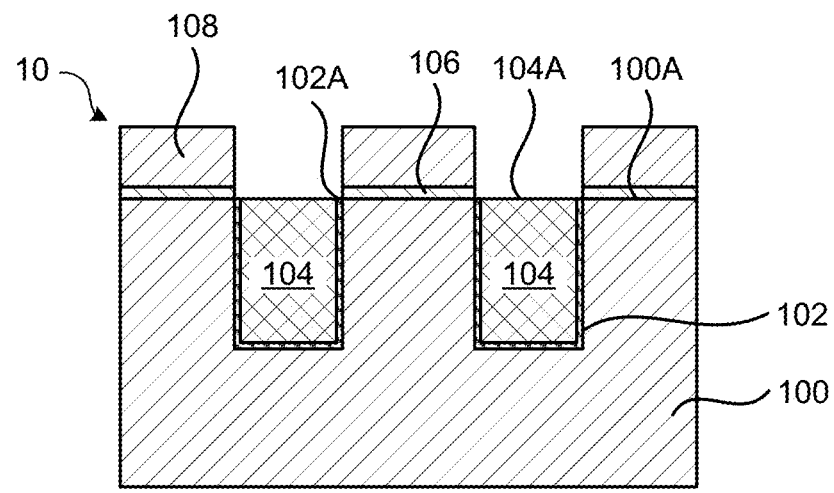

FIGS. 10A-10B show schematic cross-sectional views of a method of processing a substrate according to an embodiment of the invention. Substrate 1 from FIG. 1B has been reproduced as substrate 10 in FIG. 10A. The substrate 10 contains a metal oxide film 106 (e.g., Al$_2$O$_3$) selectively deposited or formed on the surface 100A of the dielectric material layer 100.

FIG. 10B shows a schematic cross-sectional view of a SiO$_2$ film 108 that is selectively deposited on the metal oxide film 106. The selective SiO$_2$ deposition may be performed by exposing the substrate 10 to a process gas containing a silanol gas in the absence of any oxidizing and hydrolyzing agent. This catalytic effect of the metal oxide film 106 can been observed until the SiO$_2$ film 108 is a few nm thick (~3 nm thick), and thereafter the SiO$_2$ deposition automatically stops. The inventors have discovered that oxidizing and hydrolyzing agents are not required for the selective SiO$_2$ deposition. In some examples, the process gas may further contain an inert gas such as Argon. In one embodiment, the process gas may consist of a silanol gas and an inert gas. In one example, the silanol gas may be selected from the group consisting of tris(tert-pentoxy) silanol, tris(tert-butoxy) silanol, and bis(tert-butoxy)(isopropoxy) silanol.

Furthermore, according to an embodiment, the substrate temperature may be approximately 150° C., or less, during the exposing. In another embodiment, the substrate temperature may be approximately 120° C., or less. In yet another embodiment, the substrate temperature may be approximately 100° C., or less.

Figure 11A:
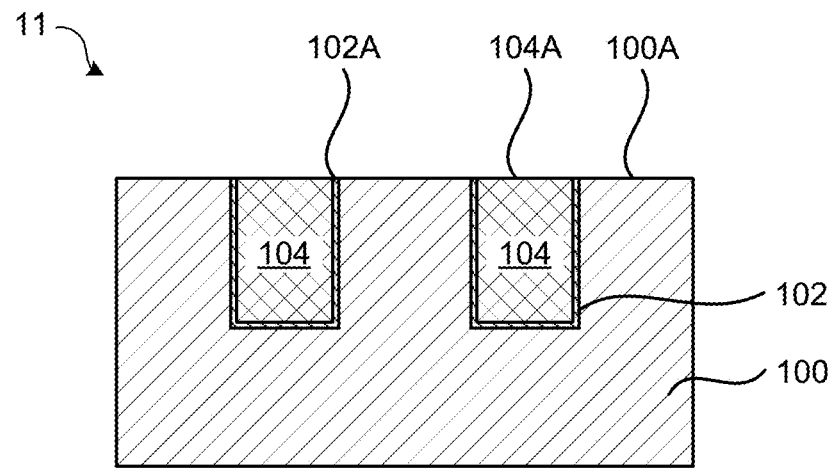
FIGS. 11A-11D show schematic cross-sectional views of a method of processing a substrate according to an embodiment of the invention.
Figure 11B:
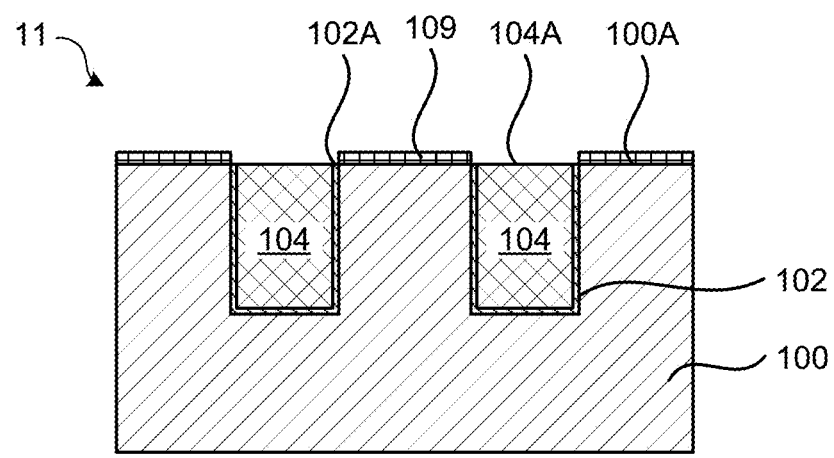
Figure 11C:
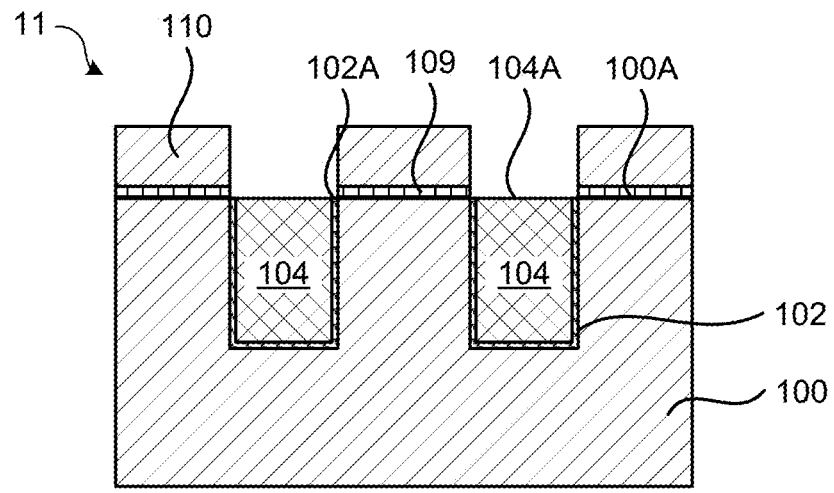
Figure 11D:
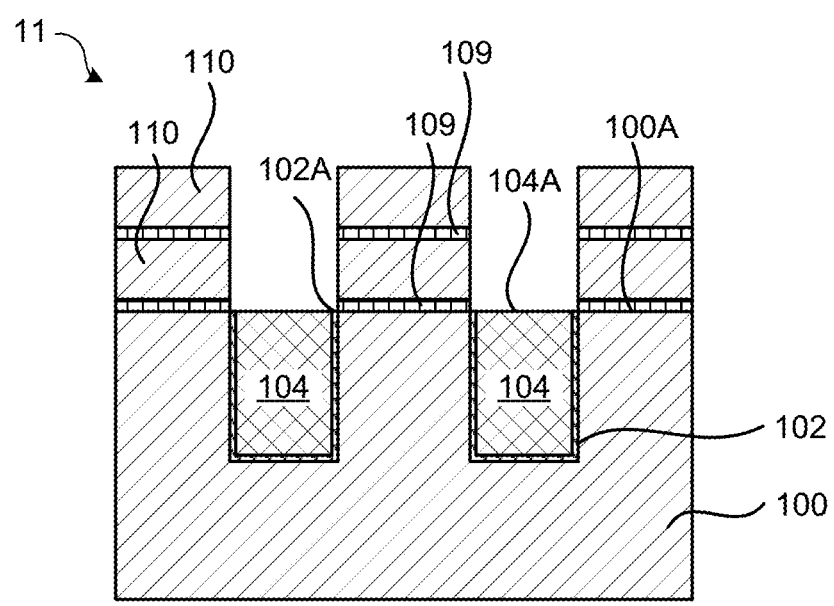

FIGS. 11A-11D show schematic cross-sectional views of a method of processing a substrate according to an embodiment of the invention. Substrate 1 from FIG. 1A has been reproduced as substrate 11 in FIG. 11A. FIG. 11B shows a metal-containing catalyst layer 109 selectively formed on the metal oxide film 106. The metal-containing catalyst layer 109 may be formed by exposing the substrate 11 to a reactant gas (e.g., perfluorodecyltrichlorosilane) that forms self-assembled monolayers on the surface 100A of the dielectric material layer 100 and on the surface 104A of the metal layer 104, and thereafter exposing the substrate 11 to a metal-containing precursor. In one example, the metal-containing catalyst layer 109 is not exposed to an oxidizing environment during the exposure of the metal-containing precursor. Examples of metal-containing precursors include aluminum (Al) and titanium (Ti). In one example, the metal-containing precursor can contain AlMe$_3$.

Selective SiO$_2$ film deposition may be carried out by utilizing the metal-containing catalyst layer 109 to catalyze selective deposition of the SiO$_2$ film 110 on the metal-containing catalyst layer 109 but not on the surface 104A of the metal layer 104.

The selective SiO$_2$ deposition may be performed by exposing the substrate 11 to a process gas containing a silanol gas in the absence of any oxidizing and hydrolyzing agent. In some examples, the process gas may further contain an inert gas such as Argon. In one embodiment, the process gas may consist of a silanol gas and an inert gas. Furthermore, according to one embodiment, the substrate temperature may be approximately 150° C., or less, during the exposing. In another embodiment, the substrate temperature may be approximately 120° C., or less. In yet another embodiment, the substrate temperature may be approximately 100° C., or less.

This catalytic effect has been observed until the $SiO_2$ film 110 is a few nm thick (~3 nm thick), and thereafter the $SiO_2$ deposition automatically stops. The selective formation of the metal-containing catalyst layer 109 and the subsequent selective deposition of the $SiO_2$ film 110 may be repeated one or more times. In one example, the steps may be repeated about 40 times before the onset of deposition of the metal-containing catalyst on the metal layer 104 occurs, thereby resulting in loss of selective $SiO_2$ deposition. This approximate number of repeats is based on the results in FIGS. 8A and 8B, where selective deposition of an $Al_2O_3$ film on a perfluorodecyltrichlorosilane pretreated $SiO_2$ layer was observed up to about 40 ALD deposition cycles.

Methods for selective film deposition using a surface pretreatment have been disclosed in various embodiments. The foregoing description of the embodiments of the invention has been presented for the purposes of illustration and description. It is not intended to be exhaustive or to limit the invention to the precise forms disclosed. This description and the claims following include terms that are used for descriptive purposes only and are not to be construed as limiting. Persons skilled in the relevant art can appreciate that many modifications and variations are possible in light of the above teaching. Persons skilled in the art will recognize various equivalent combinations and substitutions for various components shown in the Figures. It is therefore intended that the scope of the invention be limited not by this detailed description, but rather by the claims appended hereto.

What is claimed is:

1. A method of processing a substrate, comprising:
providing a substrate containing a dielectric layer and a metal layer;
exposing the substrate to a reactant gas containing a molecule that forms self-assembled monolayers (SAMs) on the substrate; and
thereafter, selectively depositing a metal oxide film on a surface of the dielectric layer relative to a surface of the metal layer by exposing the substrate to a deposition gas.

2. The method of claim 1, wherein the metal layer contains Cu, Al, Ta, Ti, W, Ru, Co, Ni, or Mo.

3. The method of claim 1, further comprising oxidizing the surface of the metal layer prior to or during the exposing of the substrate to the reactant gas.

4. The method of claim 1, wherein the molecule includes a head group, a tail group, and a functional end group, and wherein the head group includes a thiol, a silane, or a phosphonate.

5. The method of claim 1, wherein the molecule includes perfluorodecyltrichlorosilane ($CF_3(CF_2)_7CH_2CH_2SiCl_3$), perfluorodecanethiol ($CF_3(CF_2)_7CH_2CH_2SH$), chlorodecyldimethylsilane ($CH_3(CH_2)_8CH_2Si(CH_3)_2Cl$), or tertbutyl(chloro)dimethylsilane (($CH_3)_3CSi(Cl)(CH_3)_2$)).

6. The method of claim 1, wherein the metal oxide film contains $HfO_2$, $ZrO_2$, or $Al_2O_3$.

7. The method of claim 1, wherein a density of the SAMs is greater on the surface of the metal layer than on the surface of the dielectric layer.

8. The method of claim 1, wherein the exposing the substrate to the deposition gas forms metal oxide nuclei on the surface of the metal layer, the method further comprising removing, by etching, the metal oxide nuclei from the surface of the metal layer.

9. The method of claim 1, further comprising:
in the absence of any oxidizing and hydrolyzing agent, at a substrate temperature of approximately 150° C., or less, exposing the substrate to a process gas containing a silanol gas to selectively deposit a conformal $SiO_2$ film on the metal oxide film relative to the metal layer.

10. The method of claim 9, wherein the silanol gas is selected from the group consisting of tris(tert-pentoxy) silanol, tris(tert-butoxy) silanol, and bis(tert-butoxy)(isopropoxy) silanol.

11. A method of processing a substrate, comprising:
providing a substrate containing a dielectric layer and a metal layer;
exposing the substrate to a reactant gas containing a molecule that forms self-assembled monolayers (SAMs) on the substrate;
thereafter, selectively forming a metal-containing catalyst layer on a surface of the dielectric layer relative to a surface of the metal layer by exposing the substrate to a gas containing a metal-containing precursor; and
in the absence of any oxidizing and hydrolyzing agent, at a substrate temperature of approximately 150° C., or less, exposing the substrate to a process gas containing a silanol gas to selectively deposit a $SiO_2$ film on the metal-containing catalyst layer relative to the metal layer.

12. The method of claim 11, wherein the metal layer contains Cu, Al, Ta, Ti, W, Ru, Co, Ni, or Mo.

13. The method of claim 11, further comprising oxidizing the surface of the metal layer prior to or during the exposing of the substrate to the reactant gas.

14. The method of claim 11, wherein the molecule includes a head group, a tail group, and a functional end group, wherein the head group includes a thiol, a silane, or a phosphonate.

15. The method of claim 11, wherein the molecule includes perfluorodecyltrichlorosilane ($CF_3(CF_2)_7CH_2CH_2SiCl_3$), perfluorodecanethiol ($CF_3(CF_2)_7CH_2CH_2SH$), chlorodecyldimethylsilane ($CH_3(CH_2)_8CH_2Si(CH_3)_2Cl$), or tertbutyl(chloro)dimethylsilane (($CH_3)_3CSi(Cl)(CH_3)_2$)).

16. The method of claim 11, wherein the metal-containing precursor includes aluminum (Al) or titanium (Ti).

17. The method of claim 11, wherein the metal-containing precursor includes $AlMe_3$.

18. The method of claim 11, wherein a density of the SAMs is greater on the surface of the metal layer than on the surface of the dielectric layer.

19. The method of claim 11, wherein the exposing the substrate to the gas containing the metal-containing precursor forms metal-containing nuclei on the surface of the metal layer, the method further comprising removing, by etching, the metal-containing nuclei from the surface of the metal layer.

20. The method of claim 11, wherein the silanol gas is selected from the group consisting of tris(tert-pentoxy) silanol, tris(tert-butoxy) silanol, and bis(tert-butoxy)(isopropoxy) silanol.

* * * * *